(12) United States Patent
Gong et al.

(10) Patent No.: US 10,263,169 B2
(45) Date of Patent: Apr. 16, 2019

(54) PEDOT:PSS COMPOSITE FILMS HAVING ENHANCED THERMOELECTRIC PROPERTIES

(71) Applicants: Xiong Gong, Hudson, OH (US); Chao Yi, Akron, OH (US)

(72) Inventors: Xiong Gong, Hudson, OH (US); Chao Yi, Akron, OH (US)

(73) Assignee: The University of Akron, Akron, OH (US)

( * ) Notice: Subject to any disclaimer, the term of this patent is extended or adjusted under 35 U.S.C. 154(b) by 86 days.

(21) Appl. No.: 15/096,884

(22) Filed: Apr. 12, 2016

(65) Prior Publication Data

US 2017/0222113 A1 Aug. 3, 2017

Related U.S. Application Data

(60) Provisional application No. 62/288,518, filed on Jan. 29, 2016.

(51) Int. Cl.
| | |
|---|---|
| C08K 5/41 | (2006.01) |
| C09D 5/24 | (2006.01) |
| H01B 1/12 | (2006.01) |
| C08L 71/02 | (2006.01) |
| H01L 35/24 | (2006.01) |
| H01L 35/34 | (2006.01) |
| C09D 165/00 | (2006.01) |

(52) U.S. Cl.
CPC ............ *H01L 35/24* (2013.01); *C09D 5/24* (2013.01); *C09D 165/00* (2013.01); *H01B 1/127* (2013.01); *H01L 35/34* (2013.01); *C08G 2261/1424* (2013.01); *C08G 2261/3223* (2013.01); *C08G 2261/512* (2013.01); *C08G 2261/55* (2013.01); *C08G 2261/794* (2013.01)

(58) Field of Classification Search
CPC ............................. H01L 35/24; H01L 35/34
See application file for complete search history.

(56) References Cited

U.S. PATENT DOCUMENTS 8,440,496 B2 * 5/2013 Irvin ................... H01L 51/0096
257/103

OTHER PUBLICATIONS

Hwang et al, "Effect of solvent on electrical condutivity and gas sensitivity of PEDOT:PSS polymer composite films", Journal of Applied Polymer Science vol. 132, DOI 10.1022/APP.42628, pp. 1-6, published online Jul. 2, 2015.*
Yi et al, "Ehjanced Thermoelectric Properties of poly(3,4-ethylenedioxythiophene):poly(styrenesulfonate) by Binary Secondary Dopants", ACS Applied Materials & Interfaces, 2015, 7, pp. 8984-8989, Apr. 17, 2015.*
Supporting information for the Yi et al article, Apr. 17, 2015.*

* cited by examiner

*Primary Examiner* — C Melissa Koslow
(74) *Attorney, Agent, or Firm* — Renner Kenner Greive Bobak Taylor and Weber

(57) ABSTRACT

A PEDOT:PSS film having enhanced thermoelectric properties is doped with DMSO and a binary secondary dopant, such as PEO. The composition of such film causes the ratios of PEDOT in bipolaron states to be increased. As a result, the Seebeck coefficient, the electrical conductivities, and power factor of the film are increased, thereby increasing the efficiency of the film. Thus, a thermoelectric device that uses the film is able to achieve enhanced operating performance.

9 Claims, 14 Drawing Sheets

Scheme 1. Molecular structures of PEDOT:PSS, DMSO, PEO and cross-linking reaction between PSS and PEO under 150°C Scheme 1. Molecular structures of PEDOT:PSS, DMSO, PEO and cross-linking reaction between PSS and PEO under 150°C

Table 1. Component ratios between PEDOT to PSS in thin films prepared from solutions with different concentrations of PEO.

| Films from different solutions | PEDOT to PSS ratio |
|---|---|
| PEDOT:PSS+5%DMSO | 1:2.18 |
| PEDOT:PSS+5%DMSO+0.3%PEO | 1:2.59 |
| PEDOT:PSS+5%DMSO+0.5%PEO | 1:2.43 |
| PEDOT:PSS+5%DMSO+0.7%PEO | 1:2.42 |
| PEDOT:PSS+5%DMSO+1.2%PEO | 1:2.18 |

FIG-9C

PEDOT:PSS COMPOSITE FILMS HAVING ENHANCED THERMOELECTRIC PROPERTIES

CROSS-REFERENCE TO RELATED APPLICATION

This application claims the benefit of U.S. Provisional Application No. 62/288,518 filed Jan. 29, 2016, the contents of which are incorporated herein by reference.

TECHNICAL FIELD

Generally, the present invention relates to PEDOT:PSS films, such as thin films. In particular, the present invention relates to PEDOT:PSS composite films utilized in thermoelectric devices. More particularly, the present invention relates to PEDOT:PSS films treated with binary secondary dopants to enhance the thermoelectric properties of the films.

BACKGROUND OF THE INVENTION

Thermoelectric properties of a material may be expressed as $ZT=TS^2\sigma/k$, where T is the absolute temperature, and S, $\sigma$, and K, respectively, refer to the Seebeck coefficient, the electrical conductivity and the thermal conductivity of the material. Inorganic semiconductors have been utilized in the fabrication of thermoelectric devices to convert heat into electricity due to their high electrical conductivity and large Seebeck coefficient. For example, an inorganic semiconductor was designed to have a ZT of about 2.4 from the use of $Bi_2Te_3/Sb_2Te_3$, whereby the improved thermoelectric performance was due to the reduced thermal conductivity and unchanged power factor ($S^2\sigma$) of the $Bi_2Te_3/Sb_2Te_3$ compound. Furthermore, while tremendous research has been conducted to reduce thermal conductivities through the design of new complex materials, inorganic materials continue to suffer from large intrinsic thermal conductivities (>1 W/mK), which have severely limited the ability to develop improved inorganic thermoelectric devices.

However, organic thermoelectric devices, due to their low thermal conductivities (<0.5 W/mK), have emerged as a promising alternative to inorganic thermoelectric devices. In particular, among all organic semiconductor materials being used for thermoelectric devices, poly(3,4-ethylenedioxythiophene):poly(styrenesulfonate), referred to alternatively as PEDOT:PSS, has proven to be a desirable material for such thermoelectric devices. It was reported that the electrical conductivity of PEDOT:PSS thin films can be improved by three orders of magnitude via a single secondary dopant. For example, the electrical conductivity of a PEDOT:PSS thin film was improved from 0.06 S/cm to 298.52 S/cm after doping 5% (by volume) dimethyl sulfoxide (DMSO) into the PEDOT:PSS. It was also demonstrated that due to the strong interaction between DMSO and PSS, PEDOT in its polaron states were increased, which was responsible for improved electrical conductivity of the films. However, it has also been demonstrated that PEDOT in bipolaron states rather than in polaron states could achieve a larger Seebeck coefficient. Thus, it has been suggested that the undesirably low Seebeck coefficient of PEDOT:PSS thin films is due to the small amount of PEDOT in bipolaron states when the PEDOT:PSS films are doped with DMSO.

Therefore, there is a need for PEDOT:PSS thin films, doped with DMSO, which have increased PEDOT bipolaron states. In addition, there is a need for PEDOT:PSS thin films that have increased electrical conductivity, and an improved Seebeck coefficient, so as to enhance the thermoelectric properties of the PEDOT:PSS thin films. In addition, there is a need for an effective and simple process to enhance the thermoelectric properties, as well as to improve the electrical conductivity and Seebeck coefficient of PEDOT:PSS thin films.

SUMMARY OF THE INVENTION

In light of the foregoing, it is a first aspect of the present invention to provide a thermoelectric film formed of a poly(3,4-ethylenedioxythiophene):polystyrene sulfonate (PEDOT:PSS) material that includes dimethyl sulfoxide (DMSO) and a dopant that has less polar interactions with the PSS than with the DMSO.

It is another aspect of the present invention to provide a method for forming a thermoelectric film that includes the steps of providing a poly(3,4-ethylenedioxythiophene):polystyrene sulfonate (PEDOT:PSS) material; doping the PEDOT:PSS material with dimethyl sulfoxide (DMSO) and with a dopant that has less polar interaction with PSS than with the DMSO to form a mixture; and forming a film from the mixture.

BRIEF DESCRIPTION OF THE DRAWINGS

These and other features and advantages of the present invention will become better understood with regard to the following description, appended claims, and accompanying drawings wherein:

DETAILED DESCRIPTION OF THE INVENTION

The present invention contemplates a film, such as a thin-film, formed from organic material, such as a composite of PEDOT (poly(3,4-ethylenedioxythiophene) and PSS (polystyrene sulfonate), hereinafter referred to as PEDOT:PSS. In particular, the present invention processes the PEDOT:PSS film by raising the ratio of PEDOT in bipolaron states, as a result of doping the PEDOT:PSS composite with binary secondary dopants, including about 5% dimethyl sulfoxide (DMSO) and another material that possesses both a large molecular structure and less polar interactions with PSS than it does with DMSO. For example, in one aspect, the present invention may dope the PEDOT:PSS thin film with about 5% (by volume) DMSO and about 0.3% (by volume) polyethylene oxide (PEO) to achieve enhanced thermoelectric properties with a power factor ($S^2\sigma$) of 157.35 uW/mK$^2$. However, it should be appreciated that the concentration of DMSO may be any suitable concentration, such as from 1 to 10% (by volume) for example. Without changing the morphologies of the thin films, the addition of PEO into the PEDOT:PSS thin films that are also doped by 5% DMSO increase the ratios of PEDOT in bipolaron states, and also increases the charge carrier concentration in the films. This results in films with increased electrical conductivities and increased Seebeck coefficients, which is highly desirable.

It should be appreciated that in some embodiments, an article includes thermoelectric film having a poly(3,4-ethylenedioxythiophene):polystyrene sulfonate (PEDOT:PSS) material that includes 1.0 to 10.0% dimethyl sulfoxide (DMSO) and 0.1 to 1.2% polyethylene oxide (PEO), whereby such thermoelectric film is disposed upon a substrate, and at least two electrodes are coupled to the film.

In other embodiments, a method for forming a thermoelectric film includes the steps of: providing a poly(3,4-ethylenedioxythiophene):polystyrene sulfonate (PEDOT:PSS) material; doping the PEDOT:PSS material with 1.0 to 10.0% dimethyl sulfoxide (DMSO) and 0.1% to 1.2% polyethylene oxide (PEO); and forming a film from the mixture, wherein the film is formed on a substrate; and coupling at least two electrodes to the PEDOT:PSS composite film.

In still other embodiments, a method for forming a thermoelectric film includes the steps of: providing a poly (3,4-ethylenedioxythiophene):polystyrene sulfonate (PEDOT:PSS) material; doping the PEDOT:PSS material with 1.0 to 10.0% dimethyl sulfoxide (DMSO) and 0.1% to 1.2% polyethylene oxide (PEO), wherein the step of forming said film is performed by spin-coating.

Experimental Section

I. Materials

Figure 1:
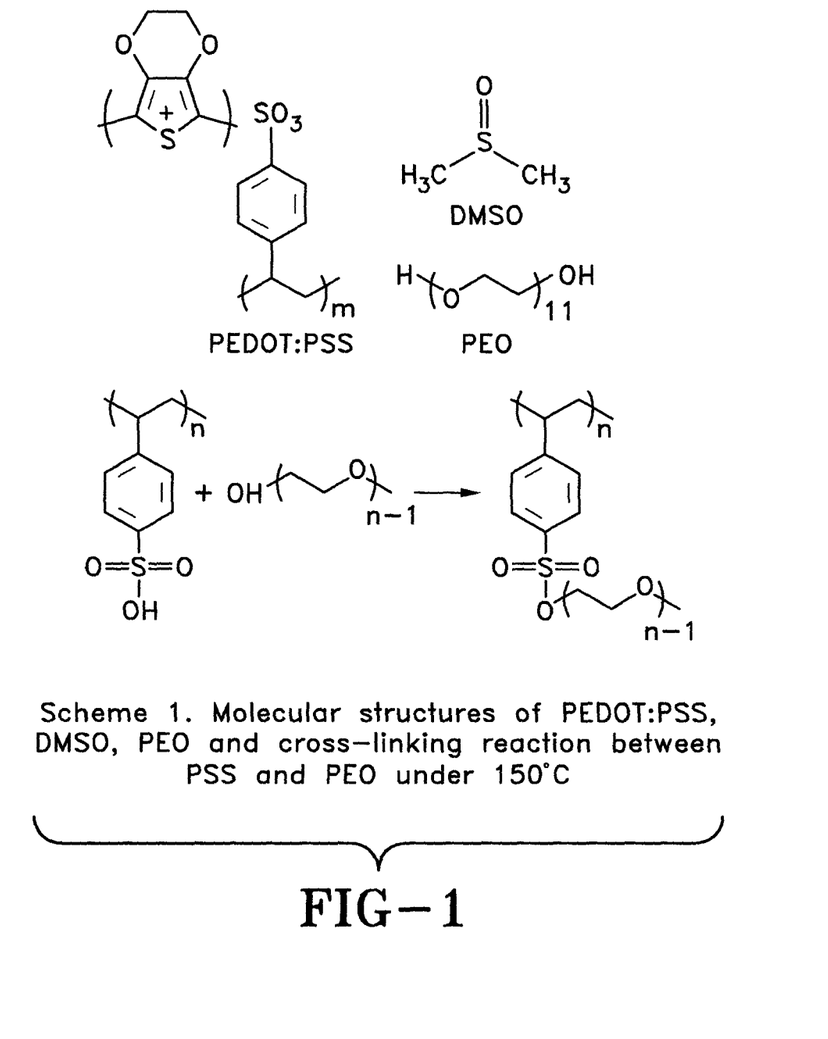
FIG. 1 is a schematic view of a molecular structure of PEDOT:PSS, DMSO, PEO (polyethylene oxide) and cross-linking reaction between PSS and PEO under 150 degrees Celsius in accordance with the concepts of the present invention.

In particular, PEDOT:PSS (Clevios PH1000) from Heraeus, PEO or polyethylene oxide (molecular weight (Mw): 500 g/mol) from Scientific Polymer Inc., and DMSO from Sigma Aldrich Inc. was used. During experimentation. Both PEO and DMSO were used as received without further purification. The molecular structures of PEDOT:PSS, DMSO and PEO are shown in FIG. 1.

II. Thin Film Preparation

Substrates were formed of bare glass with an area of about 1.0 cm×1.0 cm, and a thickness of about 1.5 mm. The bare glass substrates were chemically washed with freshly prepared pirhana solution (i.e. sulfuric acid:hydrogen peroxide with a volume ratio of 3:1) at about 50 degrees Celsius overnight. The glass substrates were then washed with deionized water. All the glass substrates were dried off using nitrogen gas. The thin films were prepared by spin coating the PEDOT:PSS solutions with about 5% DMSO (by volume), and with binary dopants, which include about 5%

DMSO and different concentrations of PEO (0.1%, 0.2%, 0.3%, 0.5%, 0.7%, 0.8%, 1.0%, and 1.2%, by volume) on to the pre-cleaned substrates. Afterward, ~100 nm aluminum (Al) electrodes were deposited upon 4 corners of the thin film through a shadow mask under a vacuum with a base pressure of about $2 \times 10^{-4}$ Pa.

III. Thin Film Characterization

The thickness of the PEDOT:PSS films were characterized by a Dektak 150 surface profilometer having a scan rate of about 0.06 mm/s. Atomic force microscopy (AFM) images were taken with a Nano-Scope NS3A (Digital Instrument), and were used to investigate the surface topology of the PEDOT:PSS films doped by about 5% DMSO and different concentrations of PEO. Raman spectra of the thin films were obtained from a Thermo Scientific DXR confocal Raman microscope equipped with a 532 nm excitation laser source and corresponding Rayleigh rejection filter and standard resolution grating. X-ray photoelectron spectroscopy (XPS) spectra of the thin films were obtained by a PHI 5000 Versa Probe II scanning XPS microprobe to identify the components in the doped PEDOT:PSS films. A Van der Pauw four-point probe method was used to measure the electrical conductivity of each of the thin films. In addition, tungsten microprobes were also put on top of the aluminum (Al) contacts having an area of about 0.75 mm by 0.75 mm. Two probes were used for applying electrical current and the other two probes were used to measure the voltage. The data was collected by a computer system using LABVIEW software. The Seebeck coefficients of the doped PEDOT:PSS films were measured by placing the thin films on two Peltier devices, which were connected with two LF13000 wavelength temperature controllers to generate a temperature difference ($\Delta T$) of about 10 K. Two T-type thermocouples were placed separately at the two sides of the thin films to monitor the actual temperatures of the surfaces of the films. Two probes connected with a Keithly 2400 source meter were placed on the Al (aluminum) contacts to measure the thermovoltage ($\Delta V$). Next, the Seebeck coefficient ($S=-\Delta V/\Delta T$) was recorded using a LABVIEW program routine. The distance between the two probes was about 0.9 cm, which was significantly larger than the size of an Al contact. Therefore, the effects of the geometry of the device was negligible. Thermal paste was used to improve thermal contact between substrates and Peltier devices and contact between the films and the thermocouples.

IV. Results

Figure 2A:
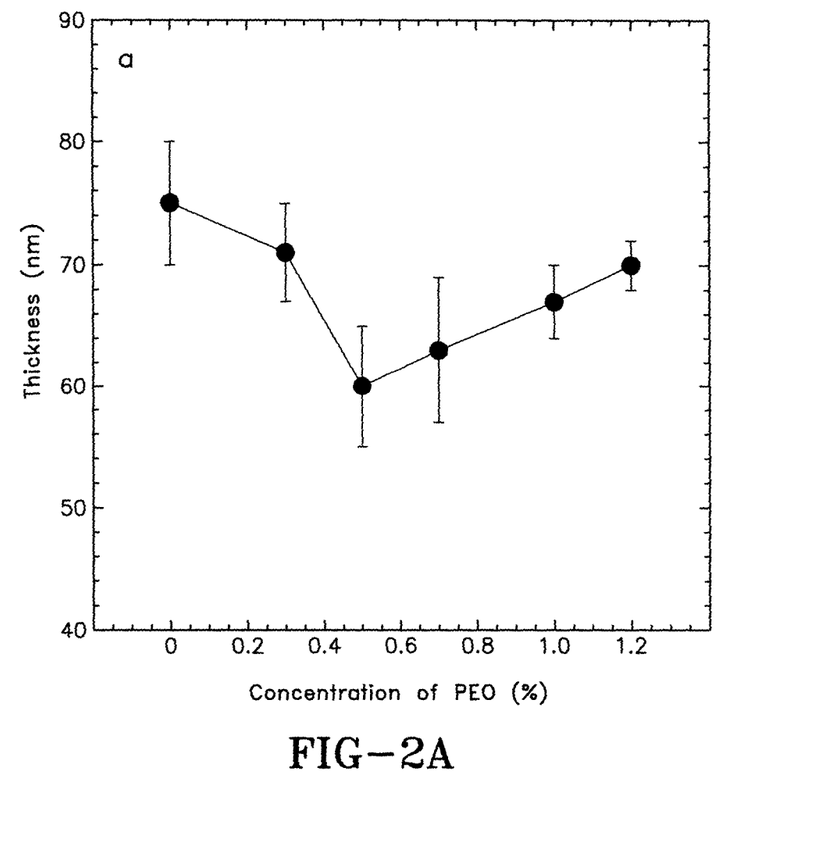
FIG. 2A is a graph showing the thickness of PEDOT:PSS films at different PEO concentrations in accordance with the concepts of the present invention.
Figure 2B:
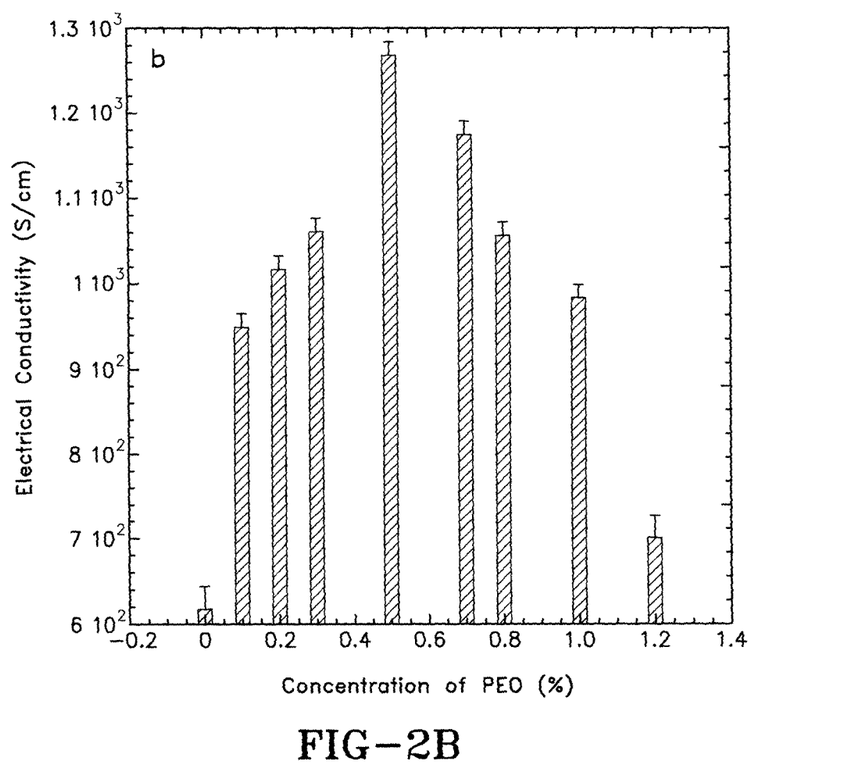
FIG. 2B is a graph showing the electrical conductivities of PEDOT:PSS films at different PEO concentrations in accordance with the concepts of the present invention.

The thicknesses of the PEDOT:PSS films doped by 5% DMSO and different concentrations of PEO are shown in FIG. 2A. With increasing concentrations of PEO up to about 0.5%, the thickness of the doped PEDOT:PSS thin films are reduced, which implies that the packing of the PEDOT molecules may be more compact in the vertical direction. The electrical conductivities of the PEDOT:PSS films doped by about 5% DMSO and different concentrations of PEO are shown in FIG. 2B. The PEDOT:PSS film with about 5% DMSO provides an average electrical conductivity of about 620 S/cm. By adding about 0.1%, 0.2%, 0.3% and 0.5% of PEO into the PEDOT:PSS thin film that is also doped by about 5% DMSO, causes the electrical conductivities of the doped PEDOT:PSS thin films to increase from about 620±26 S/cm to 945±18 S/cm, 1016±16 S/cm, 1061±16 S/cm and 1270±13 S/cm, respectively. However, when the concentration of PEO was further increased from about 0.7%, 0.8%, 1.0% to 1.2%, the electrical conductivities of the doped PEDOT:PSS thin films were reduced to about 1176±14 S/cm, 1054±16 S/cm, 980±17 S/cm to 704±24 S/cm, respectively. These results indicate that the charge carrier transport properties in the thin films can be improved by controlling the concentration of PEO in the PEDOT:PSS composites.

Figure 2C:
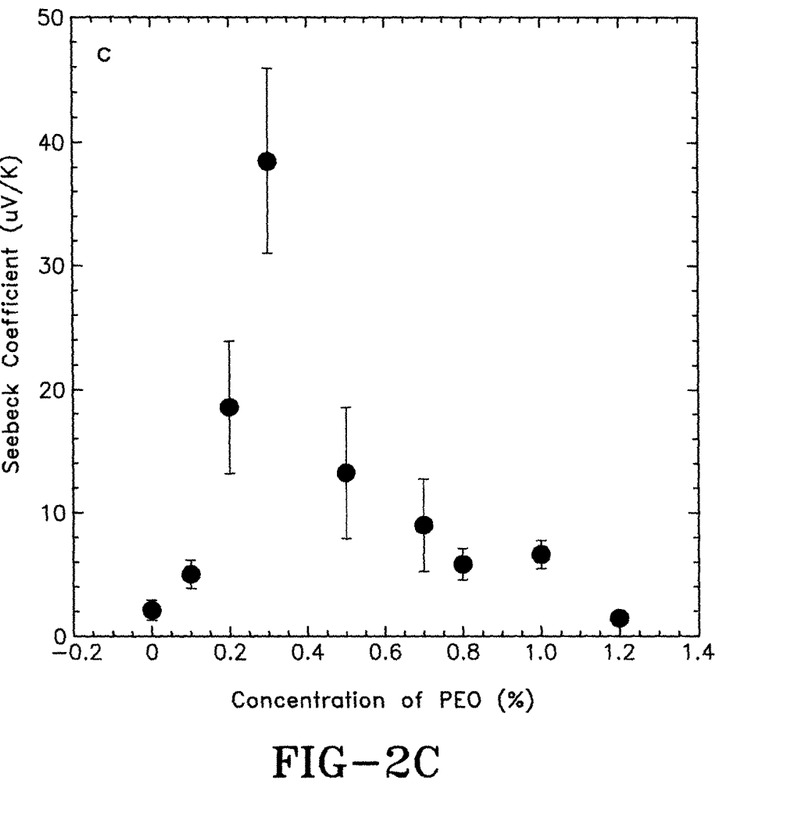
FIG. 2C is a graph showing the Seebeck coefficients of PEDOT:PSS films at different PEO concentrations in accordance with the concepts of the present invention.

The Seebeck coefficients of PEDOT:PSS thin films doped by about 5% DMSO and different concentrations of PEO are shown in FIG. 2C. The Seebeck coefficient of the PEDOT:PSS thin film doped by about 5% DMSO is about 2.2±0.7 uV/K. However, the Seebeck coefficient of the PEDOT:PSS thin film is increased to about 38.4±7.1 uV/K after being doped by about 5% DMSO and about 0.3% PEO. Further increasing the concentrations of PEO (from about 0.5%, 0.7%, 0.8%, 1.0% and up to 1.2%) in PEDOT:PSS thin film doped by about 5% DMSO, causes the Seebeck coefficients of the thin films to decrease to about 13.3±5.2 uV/K, 9.0±3.7 uV/K, 5.8±1.1 uV/K, 6.7±0.9 uV/K and 1.5±0.3 uV/K, respectively. These results confirm that the charge carrier transport properties in the doped PEDOT:PSS films were modified.

Figure 2D:
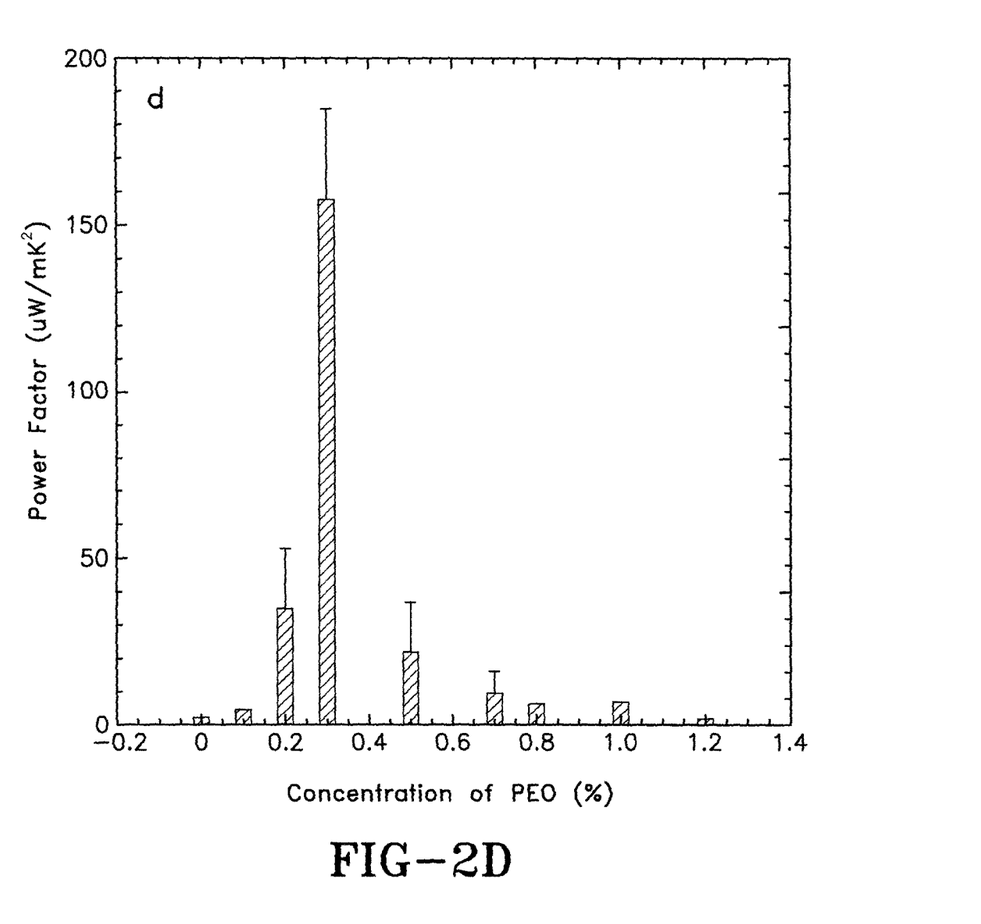
FIG. 2D is a graph showing the power factors of PEODOT:PSS films at different PEO concentrations in accordance with the concepts of the present invention.
Figure 3A:
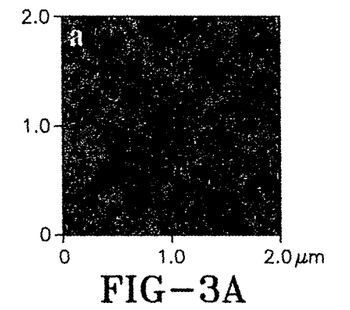
FIG. 3A is an atomic force microscopy (AFM) image showing the height of the PEDOT:PSS film doped with about 5% DMSO and about 0% PEO in accordance with the concepts of the present invention.
Figure 3B:
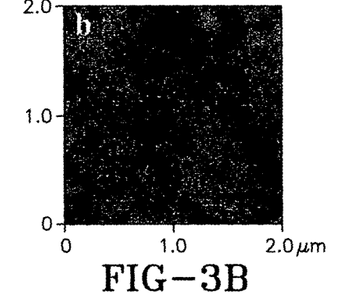
FIG. 3B is an atomic force microscopy (AFM) image showing the height of the PEDOT:PSS film doped with about 5% DMSO and about 0.1% PEO in accordance with the concepts of the present invention.
Figure 3C:
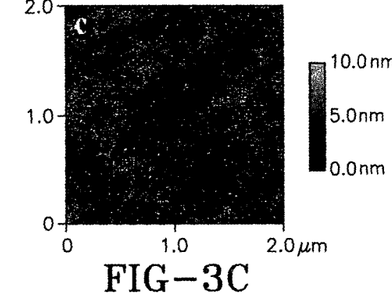
FIG. 3C is an atomic force microscopy (AFM) image showing the height of the PEDOT:PSS film doped with about 5% DMSO and about 0.2% PEO in accordance with the concepts of the present invention.
Figure 3D:
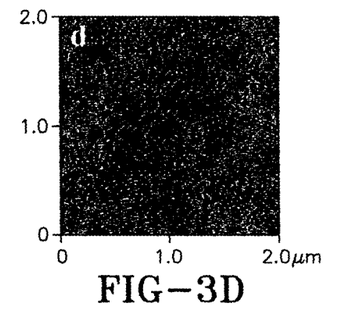
FIG. 3D is an atomic force microscopy (AFM) image showing the height of the PEDOT:PSS film doped with about 5% DMSO and about 0.3% PEO in accordance with the concepts of the present invention.
Figure 3E:
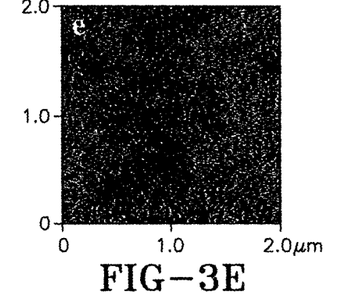
FIG. 3E is an atomic force microscopy (AFM) image showing the height of the PEDOT:PSS film doped with about 5% DMSO and about 0.7% PEO in accordance with the concepts of the present invention.
Figure 3F:
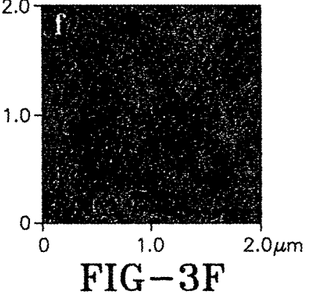
FIG. 3F is an atomic force microscopy (AFM) image showing the height of the PEDOT:PSS film doped with about 5% DMSO and about 1.0% PEO in accordance with the concepts of the present invention.

The thermal conductivities of the PEDOT:PSS thin films were very low (~0.3 W/mK) and were only slightly affected when other components were added into the PEDOT:PSS thin films. As such, the thermoelectric properties of the doped PEDOT:PSS thin films are characterized by a power factor (PF) ($S^2\sigma$). The PF values of the PEDOT:PSS thin films doped by about 5% DMSO and different concentrations of PEO are shown in FIG. 2D. The PF value is proportional to the square of the Seebeck coefficient. As discussed above, all of the doped PEDOT:PSS thin films possess electrical conductivities with the same order of magnitude, so PFs, or power factors, are dominated by the Seebeck coefficients of the films. As shown in FIG. 2D, the highest PF of about 157.35±27.01 uW/mK$^2$ was observed from PEDOT:PSS thin film doped by about 5% DMSO and about 0.3% PEO. This power factor is about 10,000 and 100 times higher than those from pristine PEDOT:PSS thin films, and PEDOT:PSS films doped by 5% DMSO, respectively. Thus, these results show that binary secondary dopants of the present invention have a substantial influence on the thermoelectric properties of the PEDOT:PSS thin films.

As a single secondary dopant, DMSO serves as a structural dopant, whereby the improved thermoelectric properties of PEDOT:PSS films are the result of the modified morphologies of the thin films. Thus, the correlation between the thermoelectric properties and the morphologies of the PEDOT:PSS thin films doped by about 5% DMSO and different concentrations of PEO are considered. The morphologies of the PEDOT:PSS films doped by about 5% DMSO and different concentrations of PEO are characterized by atomic force microscopy (AFM) images, which are shown in FIGS. 3A-F. Fiber-like PEDOT domains were observed from AFM images of the PEDOT:PSS film with about 5% DMSO. However, without changes in size and shape, fiber-like PEDOT domains still can be observed from PEDOT:PSS films that are doped by about 5% DMSO and increasing concentrations of PEO. The AFM images of the doped PEDOT:PSS films suggest that the morphologies of the films are not affected by PEO. Thus, the enhanced thermoelectric performances of the doped PEDOT:PSS films are not the result of morphology changes in the films, but are the result of the changes in the charge carrier transport properties of the films.

Figure 4:
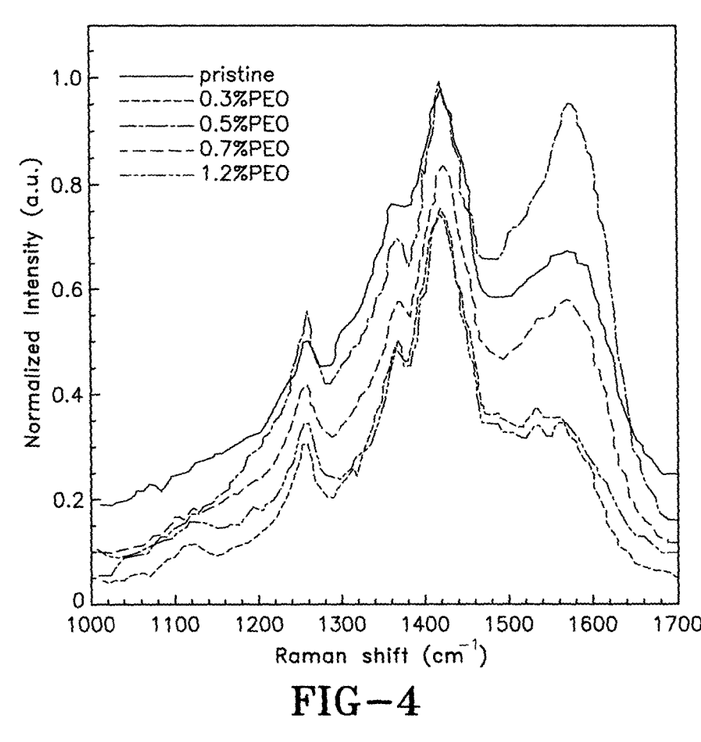
FIG. 4 is a graph showing Raman spectra of PEDOT:PSS films having different concentrations of PEO with an excitation wavelength of about 532 nm in accordance with the concepts of the present invention.

The charge carrier transport properties in PEDOT:PSS films are determined by the doping states of PEDOT in the films. To understand the origin of the change in the charge carrier transport properties and corresponding doping states of the PEDOT of the thin films, the Raman spectra of the PEDOT:PSS films doped by about 5% DMSO and different concentrations of PEO were evaluated, as shown in FIG. 4.

The Raman spectra of the doped PEDOT:PSS thin films exhibit peaks around 1420 cm$^{-1}$ and 1560 cm$^{-1}$, which corresponds to $C_\alpha=C_\beta$ symmetric stretching and $C_\alpha=C_\beta$ asymmetric stretching of PEDOT in polaron states and bipolaron states, respectively. Raman spectra of the PEDOT:PSS thin film doped by about 5% DMSO and about 0.3% PEO show that the intensity of the peak at about 1560 cm$^{-1}$ greatly increases at this peak and gets broader as compared to that of PEDOT:PSS thin film doped by about 5% DMSO. The growing and broadened peak implies that proportions of the PEDOT in bipolaron states are increased in the thin film, and that electrons could become more delocalized on the conjugated backbone of the PEDOT. Further increasing the concentrations of PEO in the doped PEDOT:PSS films, from about 0.5%, 0.7% to 1.2%, suppressed the intensity of this peak, which indicates that the ratios of PEDOT in bipolaron states are decreased and reduced to the same level of the PEO-free film. Raman spectra of the films reveal that the PEO secondary dopant can adjust the ratios of PEDOT in bipolaron states in the thin films, which may result from different molar ratios between PEDOT and PSS.

Figure 5:
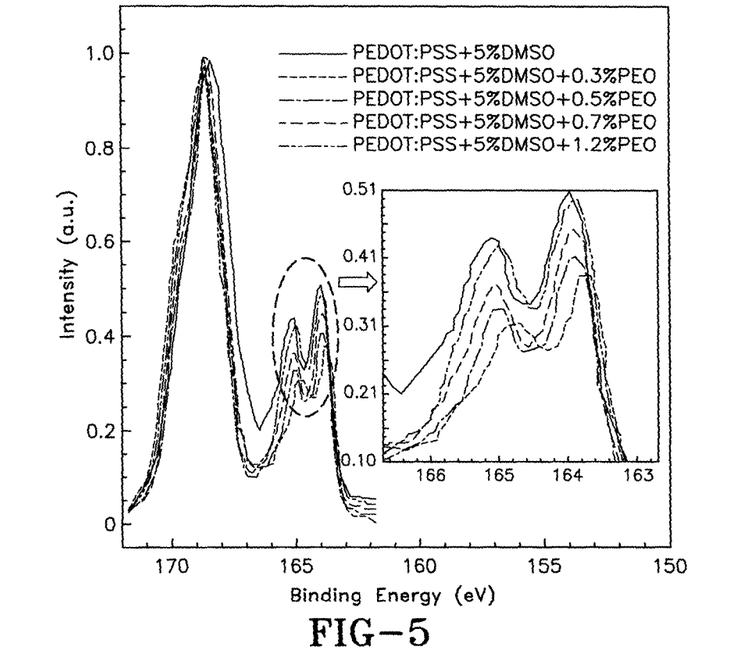
FIG. 5 is a graph showing XPS spectra of PEDOT:PSS films that are fabricated from a solution of about 5% DMSO and different concentrations of PEO, whereby the inset shows high resolution spectra in low binding energy in accordance with the concepts of the present invention.
Figure 5A:
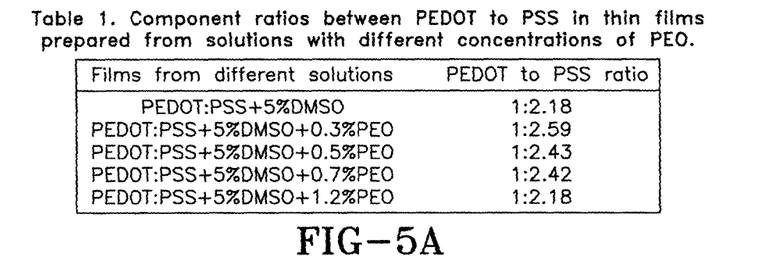
FIG. 5A is a table showing component ratios between PEDOT to PSS in the PEDOT:PSS films prepared from solutions with different concentrations of PEO in accordance with the concepts of the present invention.

The sulfur atoms in the PEDOT and in the PSS have different peaks in the X-ray photoemission spectra (XPS) of the PEDOT:PSS films, such as peaks at a binding energy of about 164 eV and 169 eV, respectively. Therefore, by comparing the intensity of the peaks from sulfuric atoms in the PEDOT:PSS films, the component ratios between the PEDOT and the PSS in the thin films may be obtained. Therefore, to further investigate the correlation between doping states of PEDOT in the films and the changed composition ratios between the PEDOT and the PSS in the PEDOT:PSS films doped with about 5% DMSO and different concentrations of PEO, peaks of sulfur atoms in XPS in the doped PEDOT:PSS films are measured, as shown in FIG. 5. By fitting the curves with a Gaussian distribution model, peaks of sulfur atoms in the XPS spectra of the thin films show that component changes (different PEDOT to PSS ratios) in the doped PEDOT:PSS films occur when the about 5% DMSO and different concentrations of PEO are used as binary secondary dopants. The ratios of PEDOT to PSS in the PEDOT:PSS films doped by about 5% DMSO and different concentrations of PEO are shown in Table 1 of FIG. 5A. In the PEDOT:PSS film with about 5% DMSO and about 0.3% PEO, the ratio changes to 1:2.59. With increasing concentrations of PEO (0.5% and 0.7%) in the thin films, the PEDOT to PSS ratio decreases to 1:2.43 and 1:2.42, respectively. This ratio goes down to 1:2.18 when 1.2% PEO is added into the doped PEDOT:PSS film. These results confirm that different concentrations of PEO in the binary dopants modify the component ratios of PEDOT to PSS, consequently, the doping states of PEDOT in the thin films are tuned.

Figure 6:
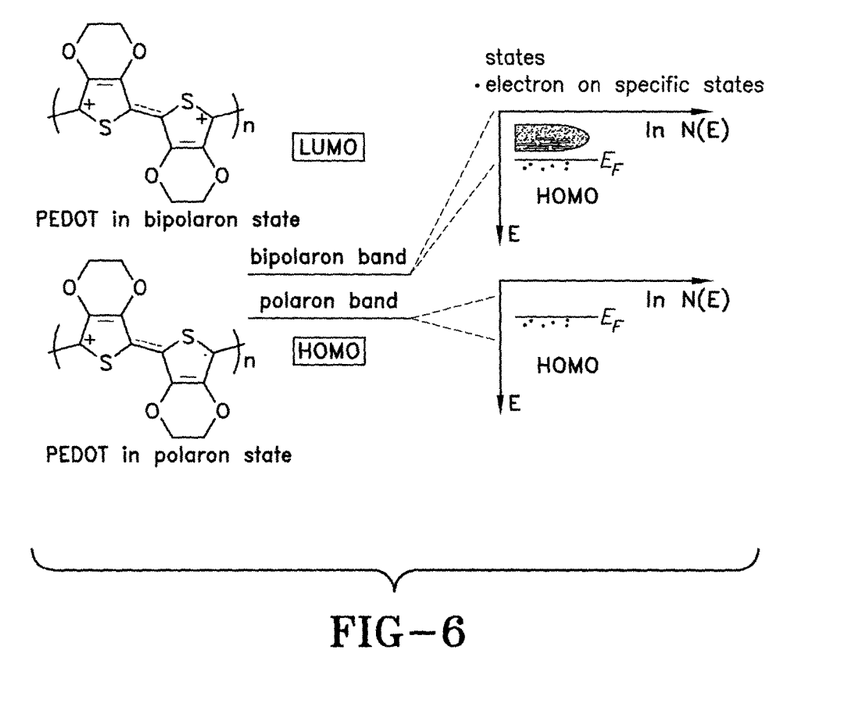
FIG. 6 is a schematic view of the electronic structures of PEDOT in polaron and bipolaron states, whereby LUMO represents the lowest unoccupied molecular orbital in accordance with the concepts of the present invention.

For PEDOT in polaron states, the Fermi level is located in the middle of the polaron states, and for PEDOT in bipolaron states, $E_F$ is located between the bipolaron states and the highest occupied molecular orbital (HOMO) level. A brief illustration of the electronic structure of the PEDOT is shown in FIG. 6. The distribution of the logarithms of density of the states is symmetric at $E_F$ for PEDOT in polaron states. However, it is highly asymmetric at $E_F$ for PEDOT in bipolaron states. Based on Mott's formula, $S \sim dN(E)/dED(E)/E_F$, whereby $N(E)$, $D(E)$ and $E_F$ are the density states of the charge carriers, diffusion coefficient of the charge carriers and the Fermi level, respectively, the Seebeck coefficient is proportional to the derivative of the density of the states at the Fermi level. Therefore, PEDOT in bipolaron states will exhibit larger Seebeck coefficients compared to that in polaron states. Thus, with the assistance of the PEO secondary dopant, the increased proportions of PSS in the films are activated to contribute to the increased ratios of PEDOT in bipolaron states in the PEDOT:PSS films, therefore increased Seebeck coefficients are obtained from the doped PEDOT:PSS films with enhanced ratios of PEDOT in bipolaron states. These results further confirm that PEDOT in bipolaron states benefit the Seebeck coefficient in PEDOT:PSS. As discussed above, with the addition of PEO, the ratios of PEDOT in bipolaron states are increased, and the fiber-like conductive PEDOT domains remain unchanged. For PEDOT in bipolaron states, there are two charge carriers in one repeating unit. So the charge carrier concentrations are increased in PEDOT:PSS thin films doped by about 5% DMSO and about 0.3% PEO compared to that in PEDOT:PSS thin film doped by about 5% DMSO only. As $\sigma=nqu$, where n, q and u are charge carrier concentrations, unit charge carrier, and charger carrier mobility, respectively; it is found that with increasing charge carrier concentrations and more compact molecular packing in the films, increased electrical conductivities are obtained by the thin films of the present invention. The electrical conductivities of the films are reduced as the ratio of PEDOT in bipolaron states is reduced when PEDOT:PSS thin films are doped by about 5% DMSO and increasing concentrations (from about 0.5% to 1.2%) of PEO. Therefore, the electrical conductivities of PEDOT:PSS are also strongly related to the ratio of PEDOT in bipolaron states, such that changes in electrical conductivities generally correspond to the changes of PEDOT in bipolaron states.

Figure 7:
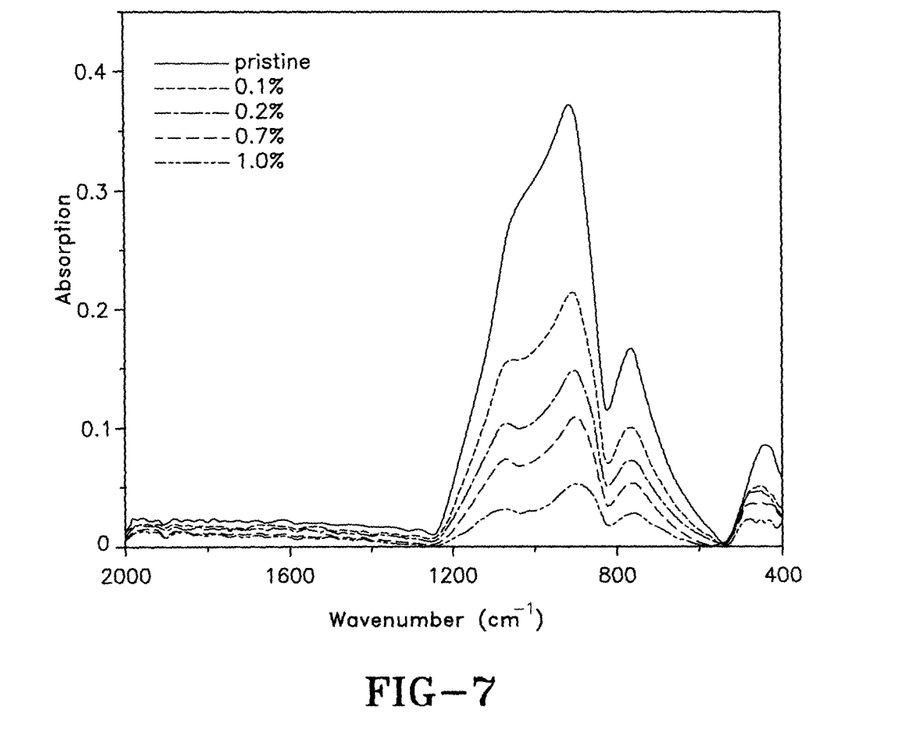
FIG. 7 is a graph showing FT-IR (Fourier transfer infrared spectroscopy) of PEDOT:PSS films with different concentrations of PEO after thermal annealing.
Figure 8A:
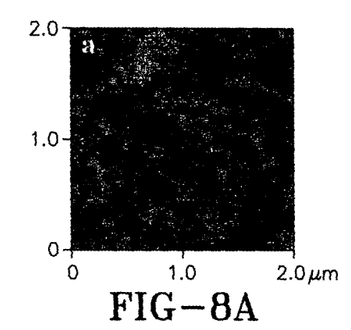
FIG. 8A is an atomic force microscopy (AFM) image showing the height of the PEDOT:PSS doped with about 5% DMSO and about 0% PEO after thermal annealing in accordance with the concepts of the present invention.
Figure 8B:
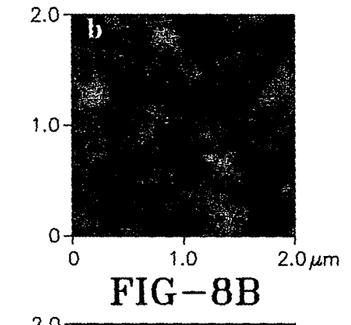
FIG. 8B is an atomic force microscopy (AFM) image showing the height of the PEDOT:PSS doped with about 5% DMSO and about 0.1% PEO after thermal annealing in accordance with the concepts of the present invention.
Figure 8C:
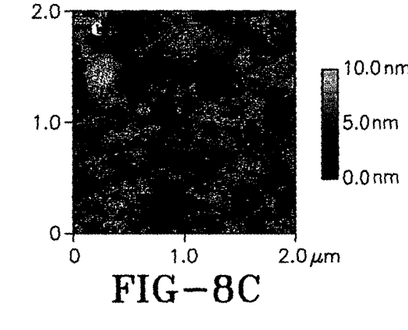
FIG. 8C is an atomic force microscopy (AFM) image showing the height of the PEDOT:PSS doped with about 5% DMSO and about 0.2% PEO after thermal annealing in accordance with the concepts of the present invention.
Figure 8D:
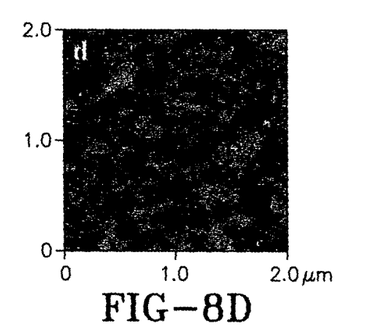
FIG. 8D is an atomic force microscopy (AFM) image showing the height of the PEDOT:PSS doped with about 5% DMSO and about 0.3% PEO after thermal annealing in accordance with the concepts of the present invention.
Figure 8E:
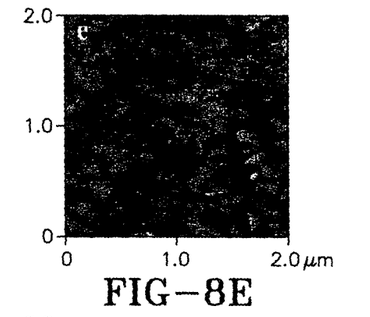
FIG. 8E is an atomic force microscopy (AFM) image showing the height of the PEDOT:PSS doped with about 5% DMSO and about 0.7% PEO after thermal annealing in accordance with the concepts of the present invention.
Figure 8F:
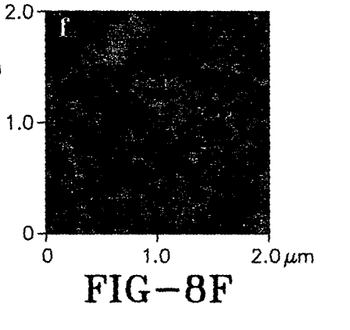
FIG. 8F is an atomic force microscopy (AFM) image showing the height of the PEDOT:PSS doped with about 5% DMSO and about 1% PEO after thermal annealing in accordance with the concepts of the present invention.
Figure 9A:
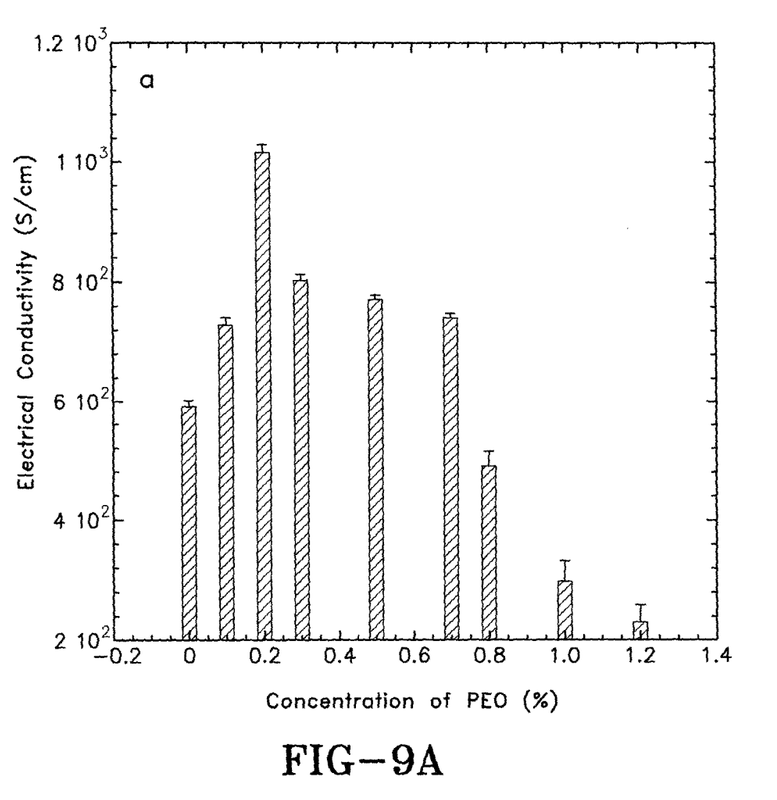
FIG. 9A is a graph showing the electrical conductivities of PEDOT:PSS films at different PEO concentrations after thermal annealing in accordance with the concepts of the present invention.
Figure 9B:
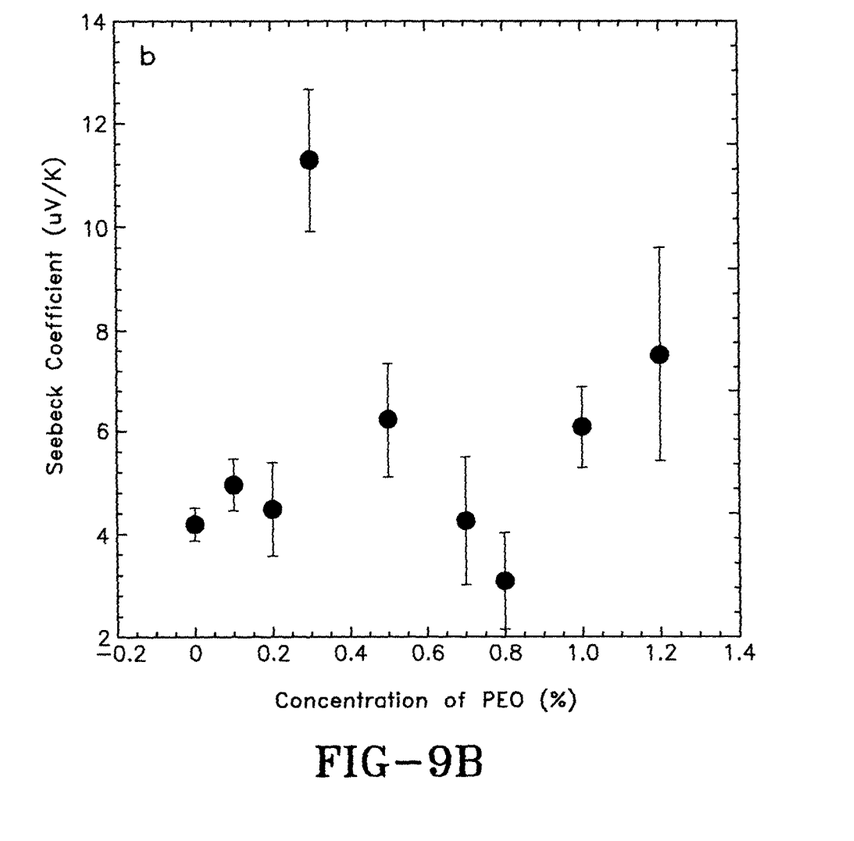
FIG. 9B is a graph showing the Seebeck coefficient of PEDOT:PSS films at different PEO concentrations after thermal annealing in accordance with the concepts of the present invention.
Figure 9C:
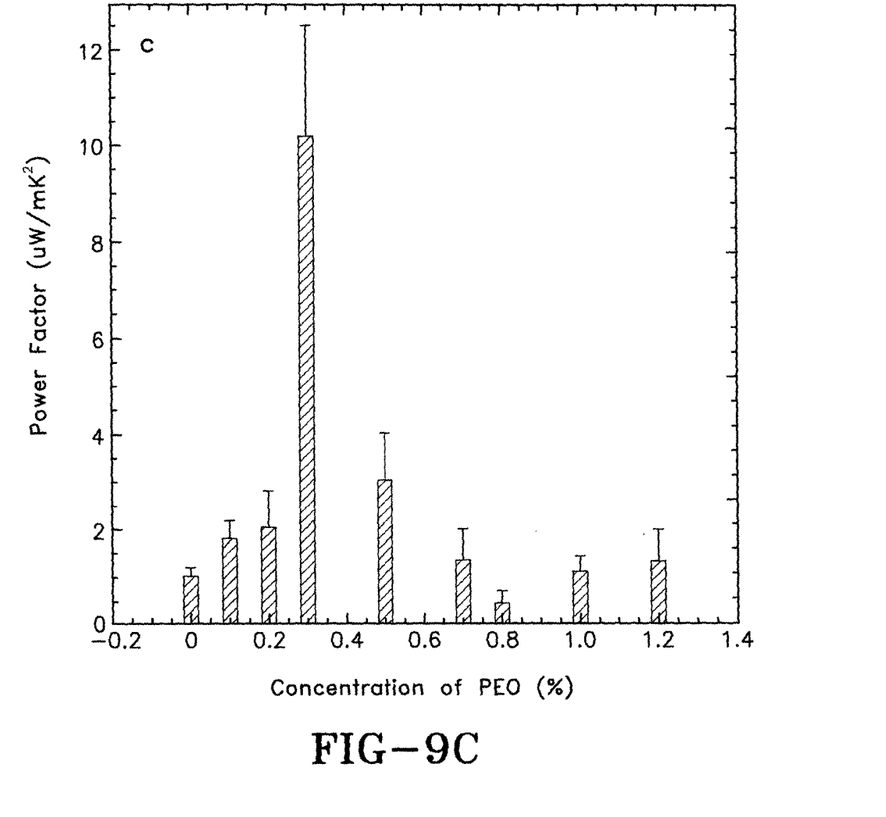
FIG. 9C is a graph showing the in power factor (PF) of PEDOT:PSS films at different PEO concentrations after thermal annealing in accordance with the concepts of the present invention.

To further verify the importance of PEDOT in bipolaron states on the thermoelectric properties of the films of the present invention, the films were thermally annealed with PEO at about 150 degrees Celsius for about 12 hours. The cross-linking reaction between the PEO and PSS is shown in FIG. 1. The chemical bond formed between the PEO and the PSS may deactivate the PSS doping agents. The chemical reaction was evaluated by Fourier transfer infrared spectroscopy (FT-IR). The FT-IR spectra of the films with PEO after thermally annealing are shown in FIG. 7. The C—O stretching peaks in the range of about 800-1200 cm$^{-1}$ increase as concentrations of PEO in the composite are increased. The reaction reduces the doping level of PEDOT in the thin films, hence, reducing the ratio of the PEDOT in bipolaron states. Therefore, the reduced electrical conductivities and Seebeck coefficients are anticipated in PEDOT:PSS with about 5% DMSO and increasing concentrations of PEO after about 12 hours of thermal annealing at about 150 degrees Celsius. AFM images, presented in FIGS. 8A-F, show morphology changes in the PEDOT:PSS thin films doped by about 5% DMSO and different concentrations of PEO after thermal annealing. Fiber-like electrical conductive PEDOT domains collapse when the cross-linking reactions occur. Therefore, the disappearance of the highly conductive PEDOT domains suggest that reduced electrical conductivities will be obtained in films after thermal annealing. The Seebeck coefficients and the electrical conductivities of PEDOT:PSS thin films doped by about 5% DMSO and different concentrations of PEO after thermal annealing are shown in FIGS. 9A-C. Reduced electrical conductivities and Seebeck coefficients are obtained. The power factors of those films are substantially suppressed. These results suggest that PEDOT with a high doping level (in polaron or bipolaron states) is crucial in determining thermoelectric performance of PEDOT:PSS based thermoelectric devices.

Thus, the present invention contemplates the use of binary secondary dopants, which include polyethylene oxide (PEO)

together with DMSO, to modify the thermoelectric properties of poly(3,4-ethylenedioxythiophene):poly(styrenesulfonate) or PEDOT:PSS thin films. The atomic force microscopy (AFM) images of the doped PEDOT:PSS films show that the addition of PEO does not change the morphologies of the films. Evaluations of the films using Raman spectra and X-ray photoelectron spectra spectroscopy (XPS) of the films of the present invention suggest that the addition of PEO tunes the component ratio of the PEDOT to PSS, and therefore results in the increased ratios of PEDOT in bipolaron states in the films. The highest ratio of PEDOT in bipolaron states was reached when about 5% DMSO and about 0.3% PEO were used as binary secondary dopants. The increased ratios of PEDOT in bipolaron states not only increased the Seebeck coefficients, but also enhanced the electrical conductivities of the thin films, and as a result, a greatly increased power factor of about 157.35 uW/mK$^2$ was obtained. The cross-linking reaction between PEO and PSS, as evidenced by the Fourier transfer infrared spectra (FT-IR) of the films, decreased the doping level of the PEDOT. And as a result, decreased electrical conductivities and Seebeck coefficients of the films are obtained.

Therefore, one advantage of the present invention is that a thermoelectric film using a PEDOT:PSS material doped with DMSO and PEO has an increased ratio of PEDOT in bipolaron states. Another advantage of the present invention is that the thermoelectric film using a PEDOT:PSS material doped with DMSO and PEO has an increased Seebeck coefficient and enhanced electrical conductivities. Still another advantage of the present invention is that the thermoelectric film using a PEDOT:PSS material doped with DMSO and PEO has an increased power factor (PF).

Thus, it can be seen that the objects of the present invention have been satisfied by the structure and its method for use presented above. While in accordance with the Patent Statutes, only the best mode and preferred embodiments have been presented and described in detail, with it being understood that the present invention is not limited thereto or thereby. Accordingly, for an appreciation of the true scope and breadth of the invention, reference should be made to the following claims.

What is claimed is:

1. A thermoelectric film comprising a poly(3,4-ethylenedioxythiophene):polystyrene sulfonate (PEDOT:PSS) material that includes 1.0 to 10.0% dimethyl sulfoxide (DMSO) and 0.1 to 1.2% polyethylene oxide (PEO).

2. The thermoelectric film of claim 1, wherein said DMSO has a concentration of about 5%.

3. The thermoelectric film of claim 2, wherein said PEO is 0.3%.

4. An article including the thermoelectric film of claim 1, wherein the film is disposed upon a substrate, and at least two electrodes are coupled to the film.

5. A method for forming a thermoelectric film comprising the steps of:
   providing a poly(3,4-ethylenedioxythiophene):polystyrene sulfonate (PEDOT:PSS) material;
   doping said PEDOT:PSS material with 1.0 to 10.0% dimethyl sulfoxide (DMSO) and 0.1% to 1.2% polyethylene oxide (PEO); and
   forming a film from said mixture.

6. The method of claim 5, wherein said DMSO has a concentration of about 5%.

7. The method of claim 5, wherein said film is formed on a substrate, and
   coupling at least two electrodes to said PEDOT:PSS composite film.

8. The method of claim 5, wherein said step of forming said film is performed by spin-coating.

9. The method of claim 6, wherein said PEO is 0.3%.

* * * * *